(12) United States Patent
Liao et al.

(10) Patent No.: US 12,421,606 B2
(45) Date of Patent: Sep. 23, 2025

(54) GAS DISTRIBUTION ASSEMBLY INCLUDING POSITIONING DEVICE

(71) Applicant: ASM IP Holding B.V., Almere (NL)

(72) Inventors: Wei Chen Liao, Hachioji (JP); Vincent Hubert Bernard Gilles Babin, Tama (JP)

(73) Assignee: ASM IP Holding B.V., Almere (NL)

( * ) Notice: Subject to any disclaimer, the term of this patent is extended or adjusted under 35 U.S.C. 154(b) by 560 days.

(21) Appl. No.: 17/897,827

(22) Filed: Aug. 29, 2022

(65) Prior Publication Data

US 2023/0069637 A1  Mar. 2, 2023

Related U.S. Application Data

(60) Provisional application No. 63/239,835, filed on Sep. 1, 2021.

(51) Int. Cl.
| | | |
|---|---|---|
| C23C 16/40 | (2006.01) | |
| C23C 16/455 | (2006.01) | |
| F16B 1/00 | (2006.01) | |

(52) U.S. Cl.
CPC ......... C23C 16/45565 (2013.01); F16B 1/00 (2013.01); *C23C 16/45525* (2013.01); *F16B 2200/99* (2023.08)

(58) Field of Classification Search
CPC ........ C23C 16/45565; C23C 16/45525; C23C 16/4412; F16B 1/00; F16B 2200/99; H01J 11/24; H01J 37/32834; H01J 2211/54

USPC .............. 118/715; 156/345.33, 345.34
See application file for complete search history.

(56) References Cited

U.S. PATENT DOCUMENTS

| | | | | |
|---|---|---|---|---|
| 5,846,332 | A * | 12/1998 | Zhao | C23C 16/46 118/500 |
| 5,885,356 | A * | 3/1999 | Zhao | H01L 21/68785 118/728 |
| 6,063,441 | A * | 5/2000 | Koai | H01J 37/32477 427/255.394 |
| 6,106,625 | A * | 8/2000 | Koai | C23C 16/455 118/724 |
| 7,276,123 | B2 * | 10/2007 | Shimizu | C23C 16/4585 156/345.31 |
| 7,722,925 | B2 | 5/2010 | White | |
| 2004/0221808 | A1 * | 11/2004 | Kawano | F16J 15/0887 118/715 |
| 2005/0208217 | A1 * | 9/2005 | Shinriki | H01J 37/32449 156/345.33 |
| 2006/0005771 | A1 * | 1/2006 | White | H01J 37/3244 118/728 |
| 2008/0054472 | A1 * | 3/2008 | Shinriki | H01L 21/76843 438/650 |
| 2010/0310772 | A1 * | 12/2010 | Tsuda | C23C 16/409 427/255.28 |
| 2014/0367359 | A1 * | 12/2014 | Nakano | C23C 16/45519 118/723 R |

(Continued)

*Primary Examiner* — Rudy Zervigon
(74) *Attorney, Agent, or Firm* — Snell & Wilmer L.L.P.

(57) ABSTRACT

A gas distribution assembly and method for reducing the eccentricity between a shower plate and an exhaust duct are disclosed. The gas distribution assembly includes positioning devices configured to reduce misalignment between the shower plate and the exhaust duct. The gas distribution assembly and method can be used to improve uniformity of film deposition thickness.

20 Claims, 9 Drawing Sheets

(56) References Cited

U.S. PATENT DOCUMENTS

| | | | |
|---|---|---|---|
| 2015/0252479 A1* | 9/2015 | Nakano | C23C 16/5096 |
| | | | 438/680 |
| 2017/0044665 A1* | 2/2017 | Shon | H01J 37/32715 |
| 2019/0122872 A1* | 4/2019 | Ghosh | C23C 16/4408 |
| 2019/0221432 A1* | 7/2019 | Adachi | C23C 16/042 |
| 2021/0071296 A1* | 3/2021 | Watarai | H01J 37/3288 |
| 2021/0074527 A1* | 3/2021 | Lee | H01J 37/32834 |
| 2021/0166924 A1* | 6/2021 | Moon | C23C 16/4412 |
| 2021/0166925 A1* | 6/2021 | Moon | C23C 16/4408 |
| 2021/0254216 A1* | 8/2021 | Mori | C23C 16/4409 |
| 2022/0119948 A1* | 4/2022 | Lee | C23C 16/45565 |
| 2022/0328293 A1* | 10/2022 | Dhanakshirur | C23C 16/4401 |
| 2022/0336240 A1* | 10/2022 | Roh | H01L 21/68 |
| 2022/0356581 A1* | 11/2022 | Narushima | C23C 16/45561 |
| 2023/0069637 A1* | 3/2023 | Liao | C23C 16/45565 |
| 2023/0089089 A1* | 3/2023 | Wong | G01B 11/24 |
| | | | 414/806 |
| 2023/0366082 A1* | 11/2023 | Yoshikawa | C23C 16/45536 |
| 2025/0207249 A1* | 6/2025 | Watarai | H01J 37/32862 |

* cited by examiner

FIG. 9

| RC | | RC1 | RC2 | | RC1 | RC2 |
|---|---|---|---|---|---|---|
| alignment Method | | POR | POR | | New | New |
| Film quality | Ave Thk [A] | 47.8 | 47.3 | → | 48.2 | 47.6 |
| | GPC [A/cycle] | 2.078 | 2.055 | | 2.097 | 2.069 |
| | R / X [%] | 7.53 | 2.94 | | 3.98 | 3.24 |
| | Range [A] | 3.60 | 1.39 | | 1.92 | 1.54 |
| | Edge 1sigma [%] | 2.05 | 0.48 | | 0.70 | 0.71 |
| Map | +/- 3.00% | | | | | |

GAS DISTRIBUTION ASSEMBLY INCLUDING POSITIONING DEVICE

CROSS-REFERENCE TO RELATED APPLICATIONS

This application claims priority to U.S. Provisional Patent Application Ser. No. 63/239,835 filed Sep. 1, 2021 titled GAS DISTRIBUTION ASSEMBLY INCLUDING POSITIONING DEVICE, the disclosure of which is hereby incorporated by reference in its entirety.

FIELD OF INVENTION

The present disclosure generally relates to an apparatus for reducing the eccentricity between a shower plate and an exhaust duct in a gas distribution assembly, and to methods of its use.

BACKGROUND OF THE DISCLOSURE

Gas-phase reactors, such as chemical vapor deposition (CVD), plasma-enhanced CVD (PECVD), atomic layer deposition (ALD), and the like often employ a gas distribution assembly including a shower plate for distributing gases to a substrate during film deposition processes. In order to achieve a desired uniformity of film deposition, it is preferred that the shower plate remain centered within the assembly. However, as temperatures change throughout the deposition process, components of the assembly may shift and/or expand, thereby causing the shower plate to deviate from the center of the assembly. This deviation from center may cause uneven gas distribution through the shower plate, resulting in varied thickness profiles across a deposited film.

Therefore, improved apparatuses and methods for depositing films with reduced eccentricity and improved uniformity are desired. Any discussion of problems and solutions set forth in this section has been included in this disclosure solely for the purposes of providing a context for the present disclosure, and should not be taken as an admission that any or all of the discussion was known at the time the invention was made.

SUMMARY OF THE DISCLOSURE

Exemplary embodiments of this disclosure provide an apparatus and method for reducing the eccentricity between a shower plate and an exhaust duct in a gas distribution assembly. While the ways in which various embodiments of the present disclosure address drawbacks of prior apparatuses and methods are discussed in more detail below, in general, various embodiments of the disclosure provide gas distribution assemblies with positioning devices and methods that can be used to improve the uniformity of film deposition when using gas provided from a shower plate of the apparatus.

In various embodiments of the disclosure, a gas distribution assembly comprises an exhaust duct comprising an outer surface and a top surface, a shower plate comprising a rim, wherein the rim comprises an outer surface and a bottom surface, and wherein the bottom surface of the rim is adjacent to the top surface of the exhaust duct, and five or more positioning devices connected to the exhaust duct adjacent to the outer surface of the rim, wherein the positioning devices are configured to reduce misalignment between the shower plate and the exhaust duct.

The positioning devices may be connected to the top surface of the exhaust duct.

In the gas distribution assembly, the eccentricity between the shower plate and the exhaust duct may be 0.8+/−0.5 mm when the gas distribution assembly is at a standard temperature and pressure. In the gas distribution assembly, the eccentricity between the shower plate and the exhaust duct may be 0.2+/−0.5 mm when the gas distribution assembly is at a process temperature and pressure.

In various embodiments, a gas distribution assembly comprises an exhaust duct comprising an outer surface and a top surface; a shower plate comprising a rim, wherein the rim comprises an outer surface and a bottom surface, and wherein the bottom surface of the rim is adjacent to the top surface of the exhaust duct; and one or more positioning devices, wherein each positioning device comprises a stopper and an attachment device, wherein the one or more positioning devices are connected to the outer surface of the exhaust duct adjacent to the outer surface of the rim, and wherein the one or more positioning devices are configured to reduce misalignment between the shower plate and the exhaust duct.

The outer surface of the exhaust duct may comprise an outer perimeter and a crevice, wherein a surface of the crevice is in closer proximity to the outer surface of the rim than the outer perimeter of the exhaust duct, and wherein the stopper is attached to the outer surface of the crevice by the attachment device.

The stopper may comprise a rectangular cross-section. The attachment device may be a screw, bolt, or other suitable device.

In accordance with these examples, the gas distribution assembly may comprise two or more positioning devices approximately evenly spaced apart around the exhaust duct.

In the gas distribution assembly in accordance with these examples, the eccentricity between the shower plate and the exhaust duct may be or 0.79+/−0.05 mm when the gas distribution assembly is at a standard temperature and pressure. In the gas distribution assembly, the eccentricity between the shower plate and the exhaust duct may be or 0.07+/−0.05 mm when the gas distribution assembly is at a process temperature and pressure.

In various embodiments, a method of facilitating alignment between a shower plate and an exhaust duct in a gas distribution assembly is provided, the method including providing an exhaust duct comprising an outer surface and a top surface; providing a shower plate comprising a rim, wherein the rim comprises an outer surface and a bottom surface, and wherein the bottom surface of the rim is adjacent to the top surface of the exhaust duct; and attaching one or more positioning devices to the outer surface of the exhaust duct adjacent to the outer surface of the rim, wherein the one or more positioning devices comprises, a stopper and an attachment device; wherein the one or more positioning devices facilitate alignment between the shower plate and the exhaust duct. The positioning device may be adjusted by manipulating (e.g., tightening or loosening) the attachment device.

In accordance with examples of the method, the outer surface of the exhaust duct includes an outer perimeter and a crevice, wherein a surface of the crevice is in closer proximity to the outer surface of the rim than the outer perimeter of the exhaust duct, and wherein attaching the one or more positioning devices comprises attaching the one or more positioning devices to the outer surface of the crevice.

These and other embodiments will become readily apparent to those skilled in the art from the following detailed description of certain embodiments having reference to the attached figures; the invention not being limited to any particular embodiment(s) disclosed.

BRIEF DESCRIPTION OF THE DRAWING FIGURES

A more complete understanding of exemplary embodiments of the present disclosure can be derived by referring to the detailed description and claims when considered in connection with the following illustrative figures.

FIG. 9 illustrates thickness profiles of film deposited in accordance with an embodiment of the disclosure.

Figure 1A:
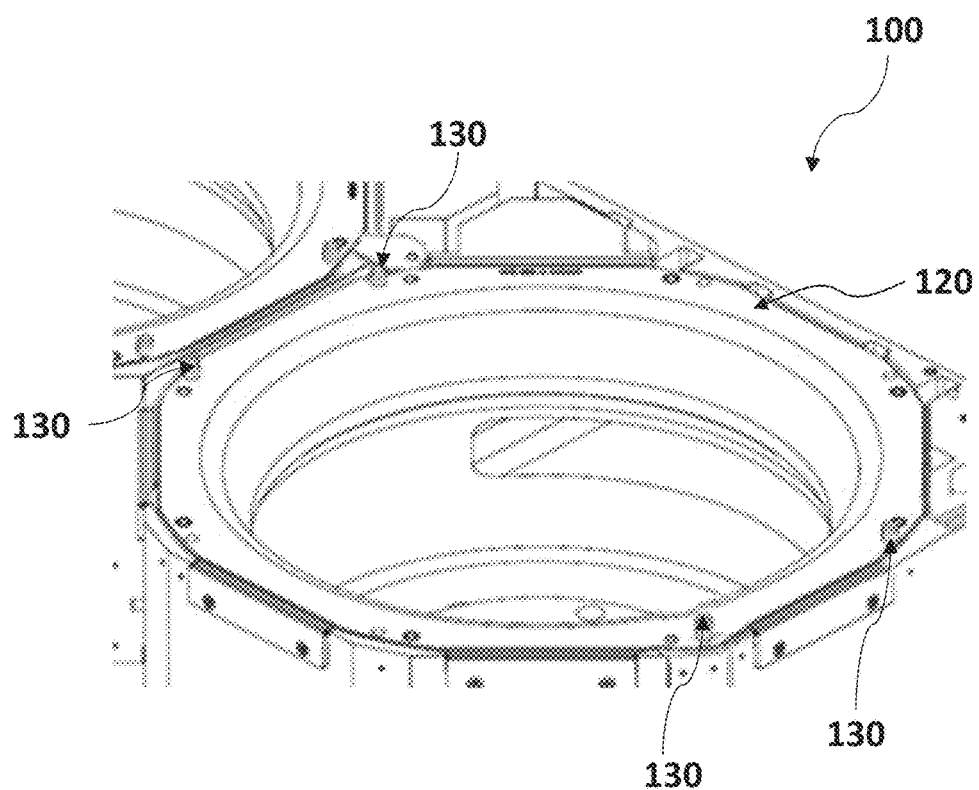
FIG. 1A illustrates a portion of a gas distribution assembly including a previous positioning device arrangement.

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION OF EXEMPLARY EMBODIMENTS

Although certain embodiments and examples are disclosed below, it will be understood by those in the art that the invention extends beyond the specifically disclosed embodiments and/or uses described herein and obvious modifications and equivalents thereof. Thus, it is intended that the scope of the invention disclosed should not be limited by the particular disclosed embodiments described below.

The present disclosure generally relates to apparatuses, assemblies, and systems that include a positioning device for reducing misalignment between a shower plate and an exhaust duct, and to methods of using the same. As set forth in more detail below, exemplary assemblies, apparatuses, systems, and methods described herein can be used to reduce the eccentricity between the shower plate and the exhaust duct for, for example, improved (e.g., deposition) uniformity of processes.

In this disclosure, "gas" can include material that is a gas at normal temperature and pressure, a vaporized solid and/or a vaporized liquid, and may be constituted by a single gas or a mixture of gases, depending on the context. A gas can include a process gas or other gas that passes through a gas supply unit, such as a shower plate, a gas distribution device, or the like. A gas can be a reactant or precursor that takes part in a reaction within a reaction chamber and/or include ambient gas, such as air.

In this disclosure, the term "eccentricity" refers to the distance between the axis of revolution of the shower plate and the axis of revolution of the exhaust duct. In this disclosure, the axis of revolution is the center point or center line of the shower plate and the exhaust duct. It is understood that the shower plate and exhaust duct have an axis of revolution, even if the outer edge of the shower plate and exhaust duct are not round.

In this disclosure, any two numbers of a variable can constitute a workable range of the variable as the workable range can be determined based on routine work, and any ranges indicated may include or exclude the endpoints. Additionally, any values of variables indicated (regardless of whether they are indicated with "about" or not) may refer to precise values or approximate values and include equivalents, and may refer to average, median, representative, majority, etc. in some embodiments. Further, in this disclosure, the terms "constituted by," "including," "include," and "having" refer independently to "typically or broadly comprising," "comprising," "consisting essentially of," or "consisting of" in some embodiments. In this disclosure, any defined meanings do not necessarily exclude ordinary and customary meanings in some embodiments.

Figure 1B:
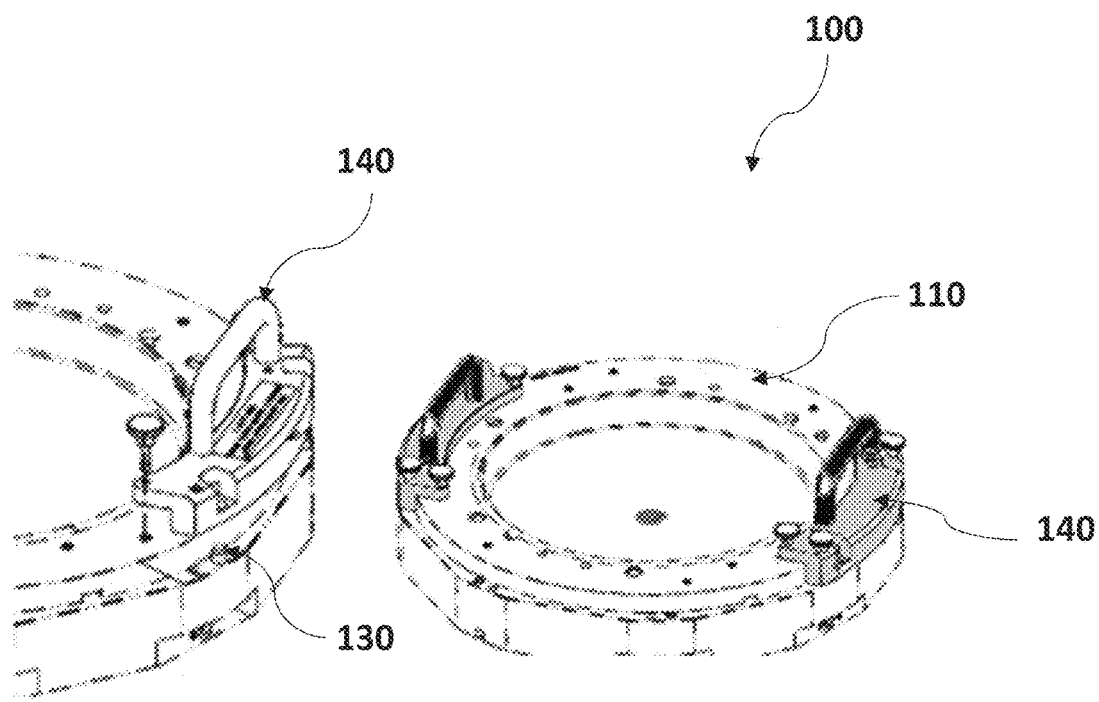
FIG. 1B illustrates the gas distribution assembly of FIG. 1A, with a shower plate exchanger attached.

Turning to the figures, FIGS. 1A and 1B illustrate portions of a gas distribution assembly 100 including a shower plate 110 and exhaust duct 120, where four pins 130 and a shower plate exchanger 140 are used to transport the shower plate 110 and position shower plate 110 on the exhaust duct 120. FIG. 1A illustrates the gas distribution assembly with no shower plate installed. FIG. 1B illustrates the gas distribution assembly 100 with a shower plate installed using a shower plate exchanger 140.

Figure 2:
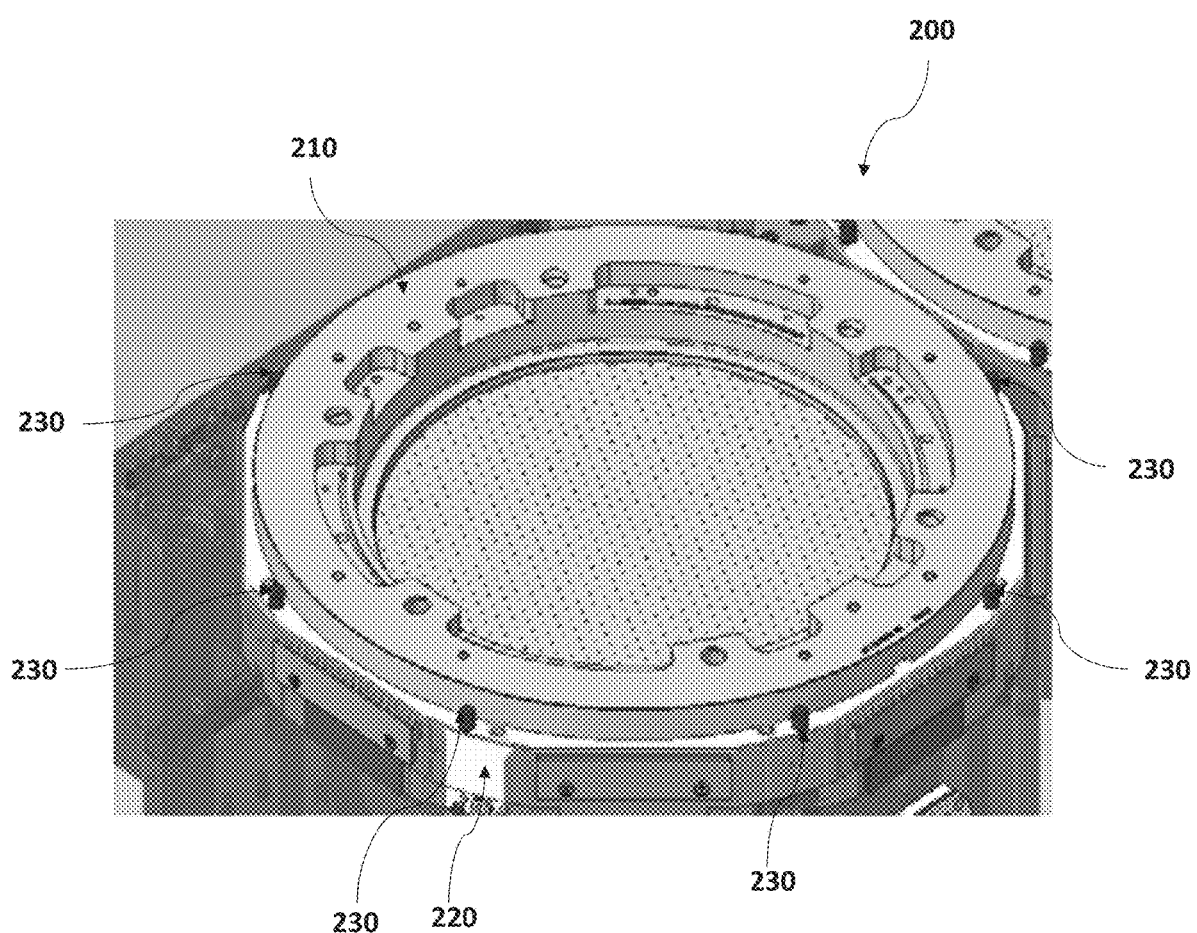
FIG. 2 illustrates a shower plate and exhaust duct with a positioning device in accordance with an embodiment of the disclosure.

FIG. 2 illustrates a gas distribution assembly 200 in accordance with an embodiment of the disclosure. Assembly 200 includes shower plate 210, exhaust duct 220, and positioning device 230. The illustrated embodiment includes eight positioning devices 230, where six positioning devices 230 are visible. In the illustrated embodiment, positioning devices 230 are approximately evenly spaced apart by approximately 45 degrees. "Approximately evenly spaced apart" means spaced apart at (360÷x)+/−5, 1, 0.5, or 0.1 degrees, where x is the number of positioning devices.

In accordance with examples of this embodiment, the gas distribution assembly 200 may comprise five or more positioning devices. In other embodiments, gas distribution assembly 200 includes several positioning devices 230, e.g. five, six, seven, eight, nine, ten, eleven, twelve etc. positioning devices, which can be, for example, approximately evenly spaced apart. In some embodiments, positioning device 230 is a pin. However, any device or mechanism, such as a screw, a bolt, or the like can be used.

Figure 3:
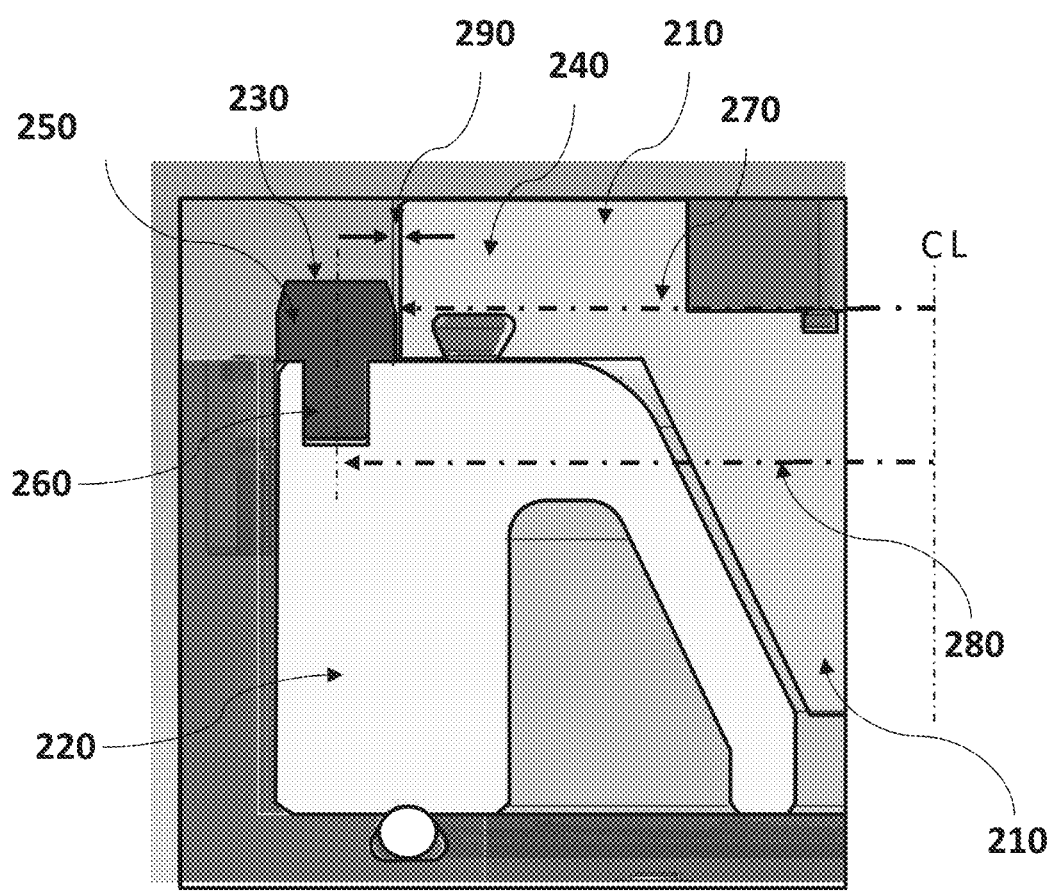
FIG. 3 illustrates a positioning device in accordance with an embodiment of the disclosure.

FIG. 3 illustrates an enlarged view of a portion of gas distribution assembly 200 showing a positioning device 230 according to an embodiment of the present disclosure. The distance or "pin gap" 290 between the positioning device 230 and a rim 240 portion of the shower plate 240 is shown. As illustrated, positioning device 230 comprises a head 250 and a body 260, where a distance across the outermost surface of the head 250 is the diameter of head 250. In the illustrated embodiment, distance 270 between the center line/axis of revolution of the shower plate/exhaust duct (CL) and the outer surface of positioning device 230 is 225+0/−0.1 mm. In the illustrated embodiment, distance 280 between CL and the center of positioning device 230 is 233+0.4/−0.4 mm. The CL illustrated in FIG. 3 is not drawn to scale relative to the other components of the device shown.

Figure 4:
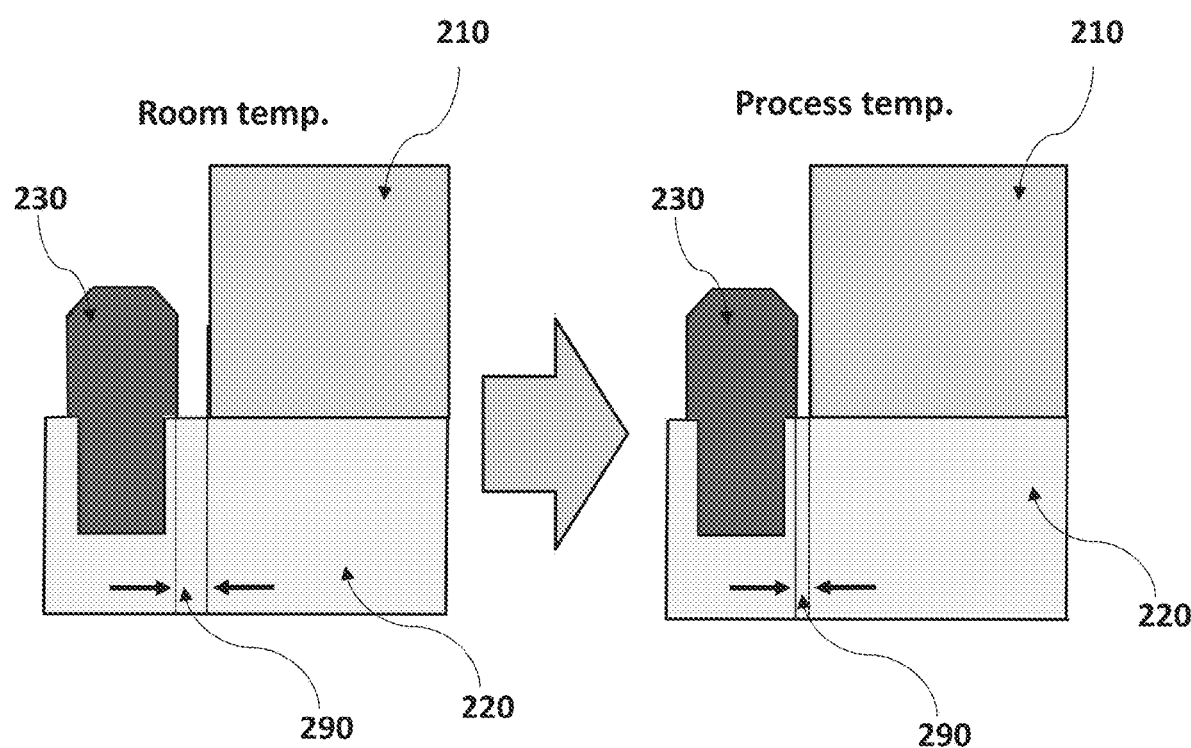
FIG. 4 illustrates the change in distance between a shower plate and a positioning device when at room temperature and a process temperature in accordance with an embodiment of the disclosure.

FIG. 4 illustrates the change in pin gap 290 when the gas distribution assembly is operating at room temperature versus a process temperature. As illustrated, a distance between positioning device 230 (or pin gap 290) and shower plate 210 is greater at room temperature or standard temperature and pressure (STP), compared to the distance at an operating pressure and temperature (e.g., at 400 Pa, 130° C. at the exhaust duct, and 150° C. at the shower plate). For example, a distance 290 between positioning device 230 and shower plate 210 may be between 0.27 mm and 1.19 mm at room temperature, and between 0 mm and 0.64 mm at process temperature. Without positioning device 230, shower plate 210 could be further misaligned at the process temperature. Use of positioning device mitigates misalignment and thus reduces eccentricity between shower plate 210 and exhaust duct 220.

Figure 6:
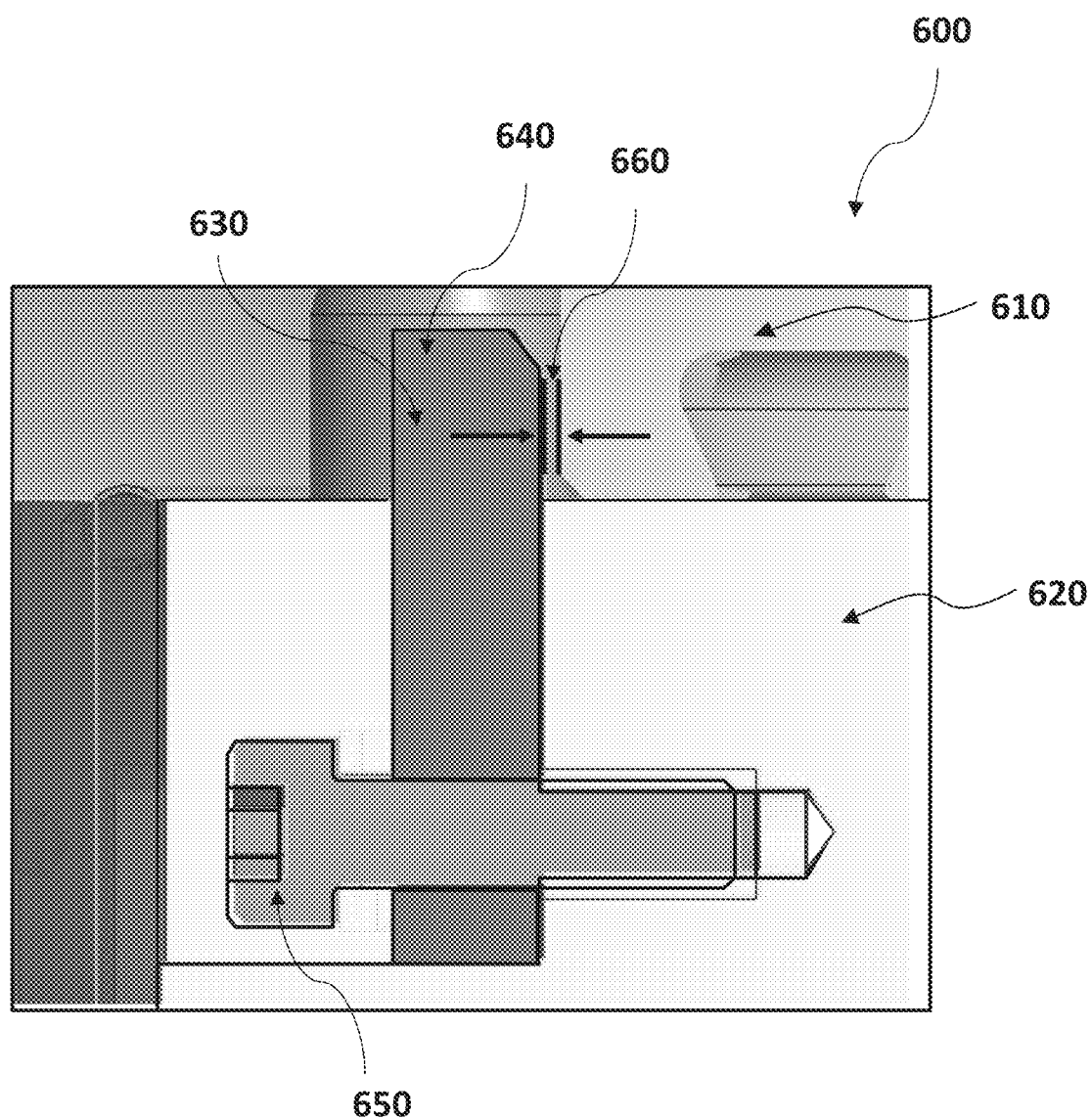
FIG. 6 illustrates a positioning device in accordance with an embodiment of the disclosure.

FIG. 6 illustrates a cross-sectional view of a portion of a gas distribution assembly 600 in accordance with another embodiment of the present disclosure. Gas distribution assembly 600 includes shower plate 610, exhaust duct 620, and positioning device 630. Positioning device 630 includes a stopper 640 and an attachment device 650. In some embodiments, stopper 640 comprises a rectangular cross-section. However, any shaped device can be used. In some embodiments, attachment device 650 is a screw. However, any device or mechanism, such as a pin, a bolt, or the like can be used. The pin gap 660 between stopper 640 and shower plate 610 is shown. Positioning device 630 provides two tolerances, one between stopper 640 and the outer surface of shower plate 610, and one between stopper 640 and exhaust duct 620. Adjusting positioning device allows for both tolerances to be reduced at relatively low cost. The distance between positioning device 630 and shower plate 610 may be greater at room temperature or STP, compared to as the distance at an operating pressure and temperature (e.g., at 400 Pa, 130° C. at the exhaust duct, and 150° C. at the shower plate). For example, a distance between positioning device 630 and shower plate 610 may be between 0.74 and 0.84 mm at room temperature, and between 0.02 mm and 0.12 mm at process temperature.

Figure 7:
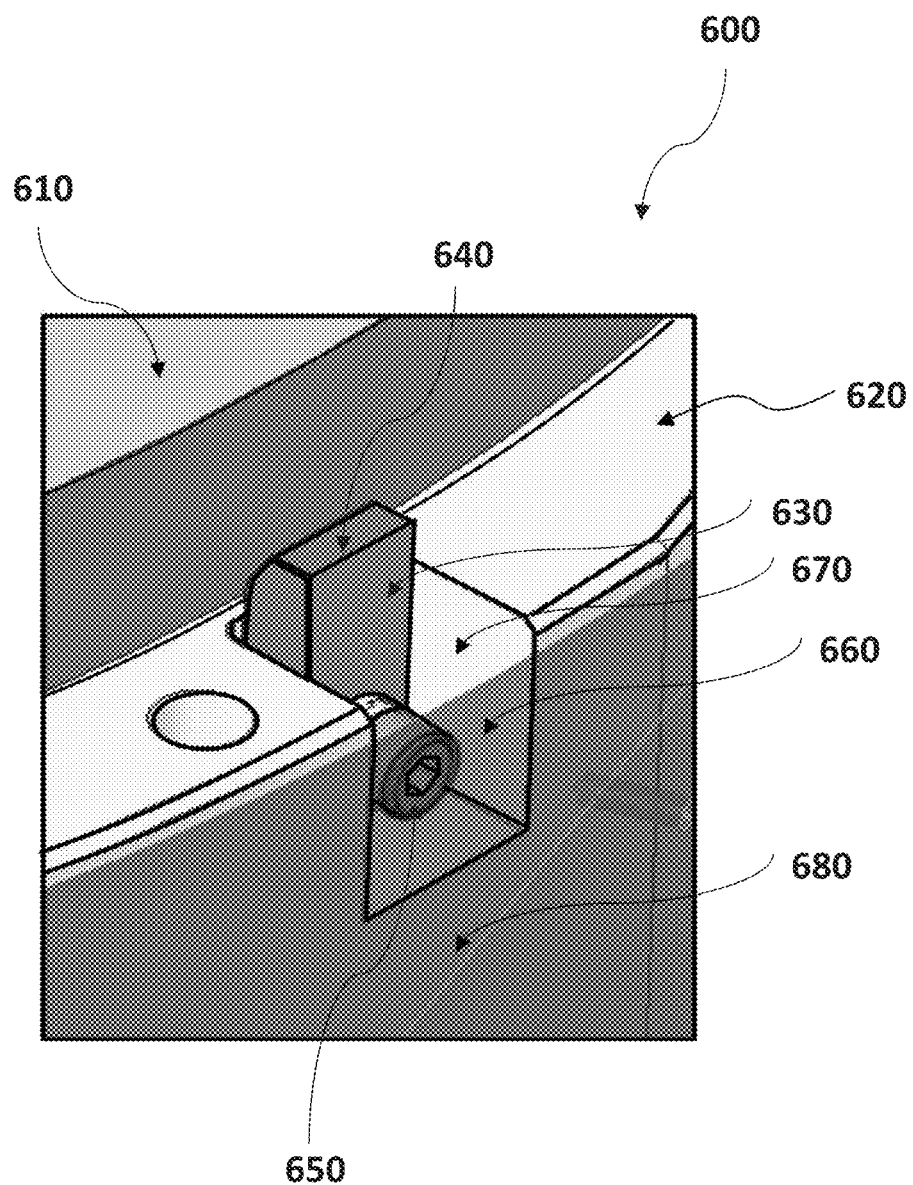
FIG. 7 illustrates a positioning device in accordance with an embodiment of the disclosure.

FIG. 7 illustrates a perspective view of portion of gas distribution assembly 600, including positioning device 630 including attachment device 650 and stopper 640. In some embodiments, exhaust duct 620 comprises a crevice 660 in which stopper 640 and attachment device 650 can be inserted. Crevice 660 may be defined by two sidewalls 670 which are wide enough to accept stopper 640, and a surface that is closer to shower plate 610 than the outer surface 680 of exhaust duct 620.

Figure 8:
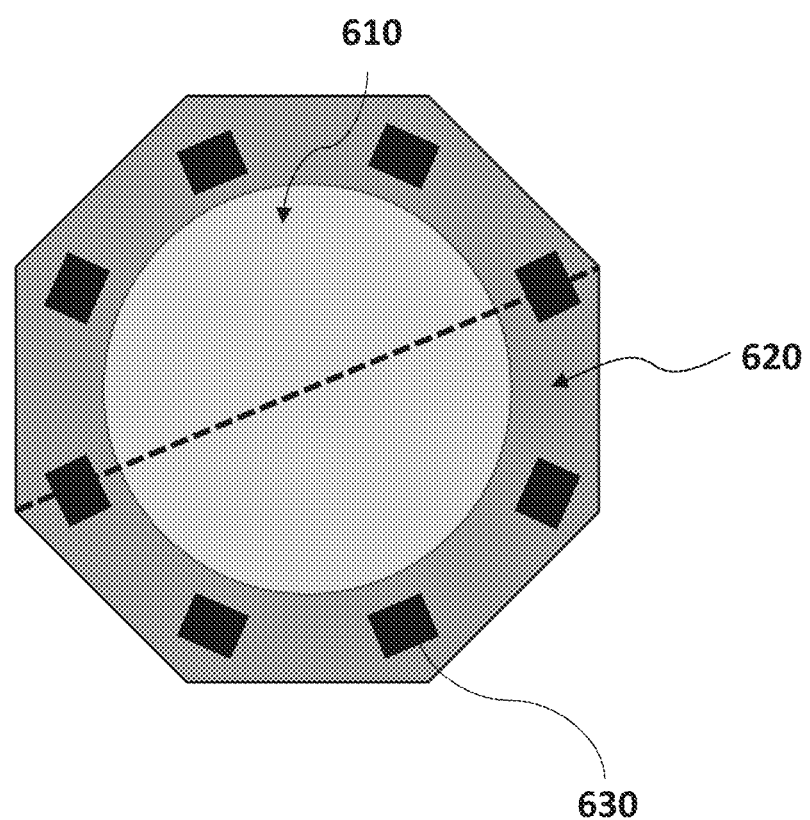
FIG. 8 illustrates a shower plate and positioning devices in accordance with an embodiment of the disclosure.

FIG. 8 illustrates a top view of shower plate 610 and exhaust duct 620 with eight positioning devices 630 approximately evenly spaced apart by approximately 45 degrees. In other embodiments two or more positioning devices 630 may be used, e.g. two, three, four, five, six, seven, nine, ten, eleven, twelve etc. positioning devices, which can be, for example, approximately evenly spaced apart.

Example 1

Figure 5:
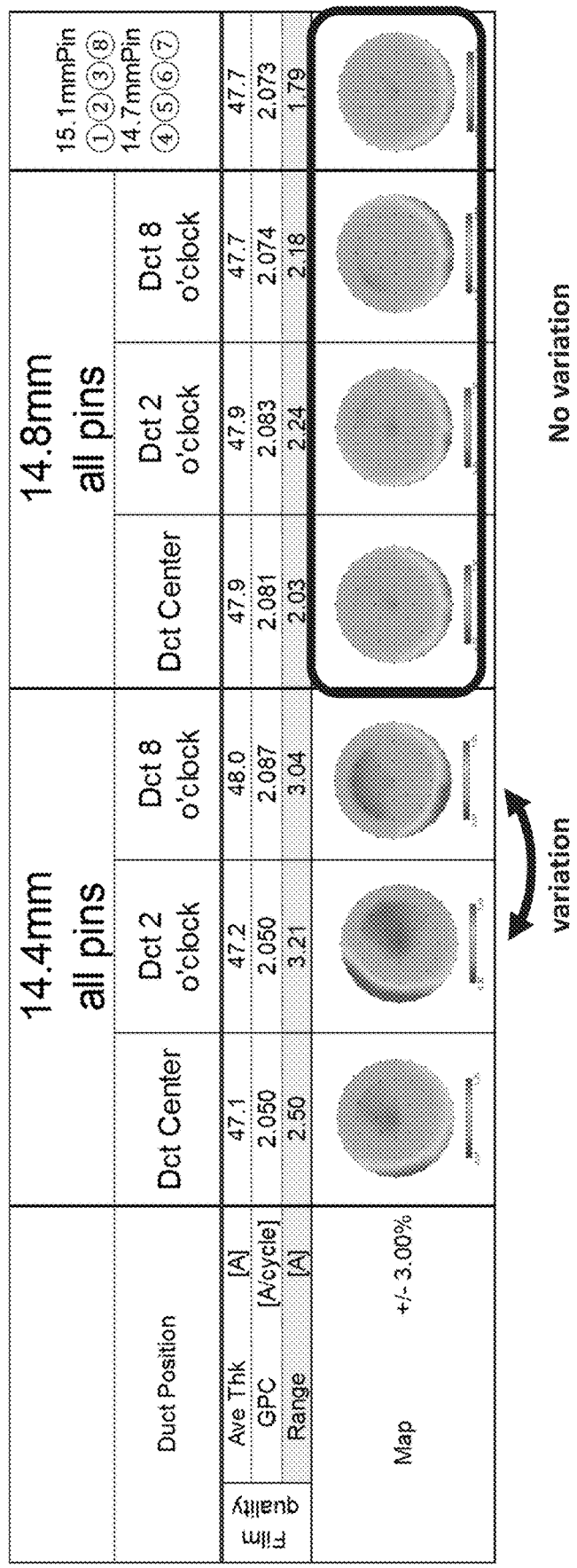
FIG. 5 illustrates thickness profiles of film deposited in accordance with an embodiment of the disclosure.

FIG. 5 shows the process performance of the gas distribution assembly including positioning device 230. Using positioning devices 230, each having a diameter of 14.8 mm, thereby reducing the pin gap, mitigating the thickness profile variation in comparison with using positioning devices 230, each having a diameter of 14.2 mm. No thickness profile variation was observed when the 14.8 mm positioning devices were observed, even when the exhaust duct was intentionally misaligned. Also, using a mixture of positioning devices 230 having 15.1 mm and 14.7 mm diameters resulted in no thickness profile variation. In other embodiments, positioning device 230 may have a head 250 ranging from 14.4 mm to 15.2 mm.

Example 2

FIG. 9 shows the process performance of the gas distribution assembly including positioning device 630. Process of record (POR) is a previous alignment method. "New" is the alignment method using the positioning device 630 of the embodiment of the present disclosure. Using positioning devices 630 in reaction chambers (RC1 and RC2) reduced the range of average thickness of the film deposited and improved the consistency of the thickness of the film deposited.

Any of the above described positioning devices can be used in any of the above described gas distribution assemblies. Alternatively, the positioning devices can be used in other assemblies.

In some embodiments, a method is provided for facilitating alignment between a shower plate and an exhaust duct in a gas distribution assembly using one or more of the above described positioning devices. For example, in some embodiments, the method includes facilitating alignment between a shower plate and an exhaust duct in a gas distribution assembly by inserting five or more positioning devices into the exhaust duct, where the exhaust duct comprises an outer surface and a top surface; the shower plate comprises a rim, the rim comprises an outer surface and a bottom surface, and the bottom surface of the rim is adjacent to the top surface of the exhaust duct, wherein the positioning devices are configured to facilitate alignment the shower plate and the exhaust duct.

The method may include inserting between five and eight positioning devices approximately evenly spaced around the exhaust duct. The method may include inserting the positioning devices into the top surface of the exhaust duct.

In some embodiments, the method may include using the gas distribution assembly 200, shower plate 210, exhaust duct 220, and positioning device 230 described above and illustrated at FIGS. 2-4.

In some embodiments, a method is provided for facilitating alignment between a shower plate and an exhaust duct in a gas distribution assembly, the method including providing an exhaust duct comprising an outer surface and a top surface; providing a shower plate comprising a rim, wherein the rim comprises an outer surface and a bottom surface, and wherein the bottom surface of the rim is adjacent to the top surface of the exhaust duct; and attaching one or more positioning devices to the outer surface of the exhaust duct adjacent to the outer surface of the rim, wherein the one or more positioning devices comprises, a stopper and an attachment device, wherein attaching the one or more positioning devices facilitates alignment between the shower plate and the exhaust duct.

The method may include attaching the one or more positioning devices at approximately evenly spaced intervals into the exhaust duct. In some cases, attaching the one or more positioning devices may comprise attaching eight positioning devices at approximately evenly spaced intervals into the exhaust duct.

In some embodiments, the method may include using the gas distribution assembly 600, shower plate 610, exhaust duct 620, and positioning device 630 with stopper 640 and attachment device 650 as described above and illustrated at FIGS. 6 and 7.

The example embodiments of the disclosure described above do not limit the scope of the invention since these embodiments are merely examples of the embodiments of the invention. Any equivalent embodiments are intended to be within the scope of this invention. Indeed, various modifications of the disclosure, in addition to those shown and described herein, such as alternative useful combinations of the elements described, may become apparent to those skilled in the art from the description. Such modifications and embodiments are also intended to fall within the scope of the appended claims.

What is claimed is:

1. A gas distribution assembly for distributing a gas to a reaction chamber comprising:
   an exhaust duct comprising an outer surface and a top surface;
   a shower plate comprising a rim, wherein the rim comprises an outer surface and a bottom surface, and wherein the bottom surface of the rim is adjacent to the top surface of the exhaust duct; and
   five or more positioning devices connected to the exhaust duct adjacent to the outer surface of the rim,
   wherein the positioning devices are configured to reduce misalignment between the shower plate and the exhaust duct.

2. The gas distribution assembly of claim 1, comprising between five and eight positioning devices approximately evenly spaced apart around the exhaust duct.

3. The gas distribution assembly of claim 1, comprising eight positioning devices approximately evenly spaced apart around the exhaust duct.

4. The gas distribution assembly of claim 1, wherein the positioning devices are connected to the top surface of the exhaust duct.

5. The gas distribution assembly of claim 1, wherein the eccentricity between the shower plate and the exhaust duct is 0.73+/−0.46 when the gas distribution assembly is at a standard temperature and pressure.

6. The gas distribution assembly of claim 1, wherein the eccentricity between the shower plate and the exhaust duct is 0.18+/−0.46 when the gas distribution assembly is at a process temperature and pressure.

7. A gas distribution assembly for distributing a gas to a reaction chamber comprising:
   an exhaust duct comprising an outer surface and a top surface;
   a shower plate comprising a rim, wherein the rim comprises an outer surface and a bottom surface, and wherein the bottom surface of the rim is adjacent to the top surface of the exhaust duct; and
   one or more positioning devices, wherein each positioning device comprises a stopper and an attachment device,
   wherein the one or more positioning devices are connected to the outer surface of the exhaust duct adjacent to the outer surface of the rim,
   wherein the one or more positioning devices are configured to reduce misalignment between the shower plate and the exhaust duct.

8. The gas distribution assembly of claim 7, wherein the outer surface of the exhaust duct comprises an outer perimeter and a crevice,
   wherein a surface of the crevice is in closer proximity to the outer surface of the rim than the outer perimeter, and
   wherein the stopper is attached to the surface of the crevice by the attachment device.

9. The gas distribution assembly of claim 7, wherein the stopper comprises a rectangular cross-section, and wherein the attachment device is a screw.

10. The gas distribution assembly of claim 7 comprising two or more positioning devices approximately evenly spaced apart around the exhaust duct.

11. The gas distribution assembly of claim 7 comprising eight positioning devices approximately evenly spaced apart around the exhaust duct.

12. The gas distribution assembly of claim 7, wherein the eccentricity between the shower plate and the exhaust duct is 0.79+/−0.05 when the gas distribution assembly is at a standard temperature and pressure.

13. The gas distribution assembly of claim 7, wherein the eccentricity between the shower plate and the exhaust duct is 0.07+/−0.05 when the gas distribution assembly is at a process temperature and pressure.

14. A method of facilitating alignment between a shower plate and an exhaust duct in a gas distribution assembly, the method comprising:
   providing an exhaust duct comprising an outer surface and a top surface;
   providing a shower plate comprising a rim, wherein the rim comprises an outer surface and a bottom surface, and wherein the bottom surface of the rim is adjacent to the top surface of the exhaust duct; and
   attaching one or more positioning devices to the outer surface of the exhaust duct adjacent to the outer surface of the rim, wherein the one or more positioning devices comprises, a stopper and an attachment device;
   wherein attaching the one or more positioning devices facilitates alignment between the shower plate and the exhaust duct.

15. The method of claim 14, wherein attaching the one or more positioning devices comprises attaching two or more positioning devices at approximately evenly spaced intervals into the exhaust duct.

16. The method of claim 14, wherein attaching the one or more positioning devices comprises attaching eight positioning devices at approximately evenly spaced intervals into the exhaust duct.

17. The method of claim 14, wherein the outer surface of the exhaust duct comprises an outer perimeter and a crevice,
   wherein a surface of the crevice is in closer proximity to the outer surface of the rim than the outer perimeter, and
   wherein attaching the one or more positioning devices comprises attaching the one or more positioning devices to the surface of the crevice.

18. The method of claim 14, wherein the stopper comprises a rectangular cross-section.

19. The method of claim 14, wherein the attachment device is a screw.

20. The method of claim 14, further comprising adjusting the positioning device by tightening or loosening the attachment device.

* * * * *